US006580127B1

(12) United States Patent
Andry et al.

(10) Patent No.: US 6,580,127 B1
(45) Date of Patent: Jun. 17, 2003

(54) HIGH PERFORMANCE THIN FILM TRANSISTOR AND ACTIVE MATRIX PROCESS FOR FLAT PANEL DISPLAYS

(75) Inventors: Paul S. Andry, Mohegan Lake, NY (US); Frank R. Libsch, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/409,157

(22) Filed: Sep. 30, 1999

(51) Int. Cl.$^7$ .............................................. H01L 27/01
(52) U.S. Cl. ......................................... 257/347; 257/59
(58) Field of Search .............................. 257/59, 72, 61, 257/71, 347, 350

(56) References Cited

U.S. PATENT DOCUMENTS 5,021,850 A  *  6/1991  Tanaka et al. ................ 257/72
5,700,699 A      12/1997  Han et al.
6,188,452 B1 *  2/2001  Kim et al. ..................... 257/59
6,215,130 B1 *  4/2001  Dodabalapur ................ 257/67

* cited by examiner

Primary Examiner—Mark V. Prenty
(74) Attorney, Agent, or Firm—F. Chau & Associates, LLP; Robert M. Trepp

(57) ABSTRACT

A transistor, in accordance with the present inventions includes a gate electrode layer formed on a substrate and an insulating layer formed on the gate electrode layer. A first conductive layer forms a first portion and a second portion separated by a gap therebetween. The gap is formed at a position corresponding to a gate electrode in the gate electrode layer. A doping layer is formed on the first portion and the second portion of the first conductive layer, forming a source and a drain for the transistor. A semiconductor layer is formed over the doping layer of the first portion and the second portion and in the gap in contact with the insulating layer such that upon activation of the gate electrode current flows across the gap directly between the first portion and the second portion in the first conductive layer. Methods for fabrication and other embodiments are also included.

12 Claims, 11 Drawing Sheets

FIG. 10A
FIG. 10B
FIG. 10C
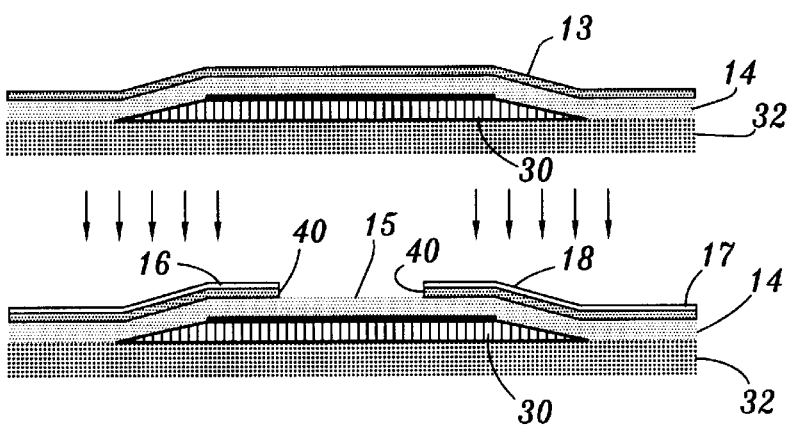
FIG. 10D
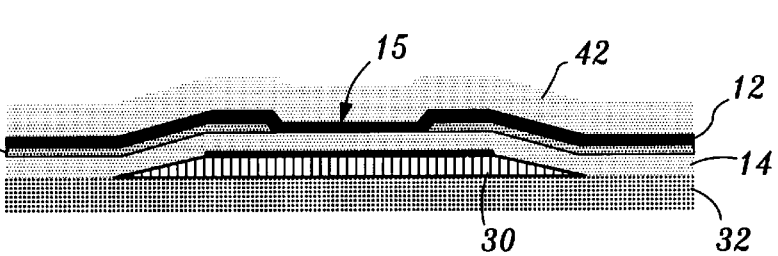
FIG. 10E
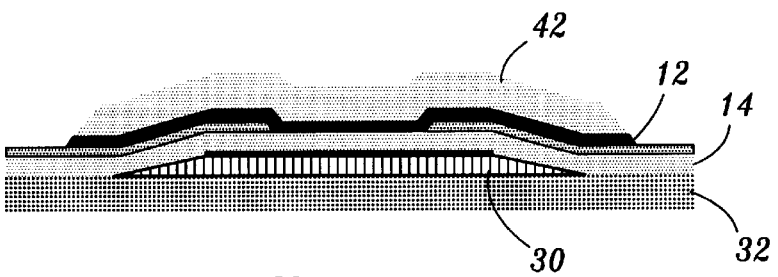
FIG. 10F
FIG. 10G
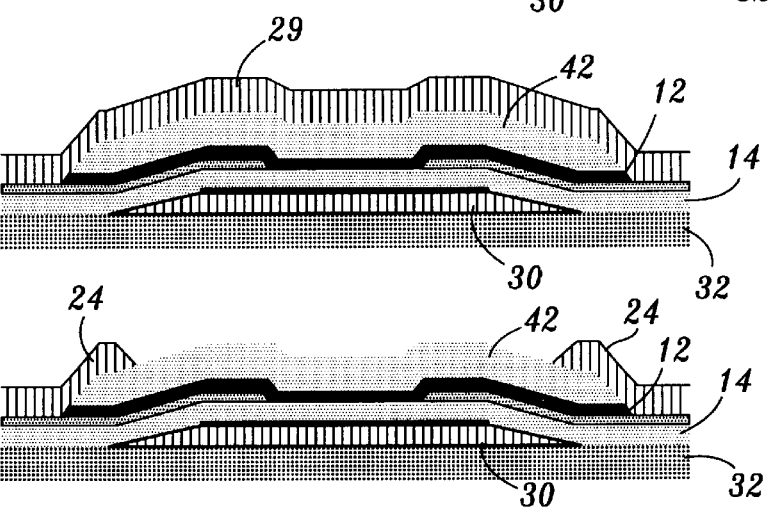

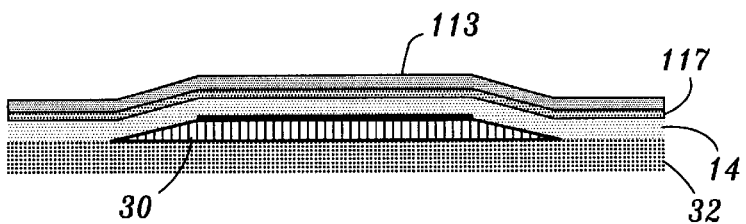
FIG. IIA
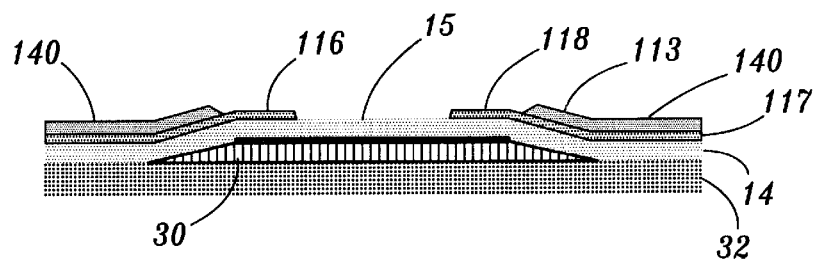
FIG. IIB
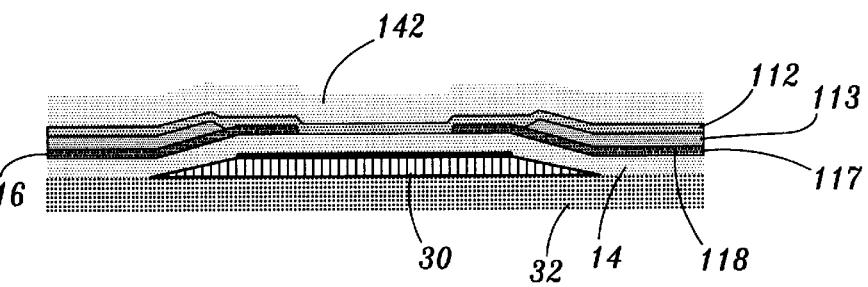
FIG. IIC

HIGH PERFORMANCE THIN FILM TRANSISTOR AND ACTIVE MATRIX PROCESS FOR FLAT PANEL DISPLAYS

BACKGROUND OF THE INVENTION

1. Field of the Invention

The present invention relates to display devices, and more particularly to a high performance thin film transistor (TFT) and a method with a low mask count process for fabricating the same.

2. Description of the Related Art

The design of larger area, higher resolution, and full color Liquid Crystal Displays (LCDs) may include problems such as incomplete pixel charging, increasing pixel voltage error, signal delay, flicker, or/and crosstalk, etc. The most widely incorporated technology today for LCDs is hydrogenated amorphous silicon (a-Si:H) as the active material of the transistor.

For full color representation, unsaturated regions of the LC brightness-voltage (B-V) characteristics curve must be utilized, and brightness is easily affected by a small change in voltage applied to the liquid crystal. In thin film transistors (TFTs), voltage distortion (dVs) induced by a gate-source capacitance coupling occurs when the gate voltage changes from the on state to the off state. Consequently, degradation display quality, such as gradation of brightness and sticking images, results.

One solution of this problem includes the minimization; of the parasitic capacitances associated with the TFT's overlapping source and drain electrodes. The reduction of these parasitic capacitances may also provide an area reduction of the designed storage capacitance, which in turn will increase a fill factor ratio.

Another concern for large content displays is proper pixel charging during the available scan time. During the scan time, the TFT "ON" current must fully charge the LC pixel capacitance to the appropriate gray scale voltage. The TFT "ON" current is established by the accumulation of electrons in the channel, and is intrinsically limited by the electron mobility of this material in the extended states.

Another concern, for flat panel displays competing in the monitor market which is presently dominated by mature cathode ray tube (CRT) technology, is reducing the active matrix LCD (AMLCD) cost of manufacturing. Today's a-Si:H TFT AMLCD fabrication processes require five to six photolithographic steps. The fabrication cost of the active matrix is approximately proportional to the number of photo lithographic steps. To date, no AMLCD manufacturer is known to be practicing a 4 mask process due to such reasons as the sacrifice in either yield and/or TFT performance (and hence display performance).

Therefore, a need exists for a high performance TFT structure which alleviates the problems and issues described above. A further need exists for a TFT structure which provides a coplanar source and drain-to-gate self-aligned a-Si:H TFT and/or source and drain n+a-Si:H junctions which are directly adjacent to and contacting an accumulated channel. A further need exists for a method of manufacturing a display device which reduces a number of mask steps without reducing yield.

SUMMARY OF THE INVENTION

A transistor, in accordance with the present invention includes a gate electrode layer formed on a substrate and an insulating layer formed on the gate electrode layer. A first conductive layer forms a first portion and a second portion separated by a gap therebetween. The gap is formed at a position corresponding to a gate electrode in the gate electrode layer. A doping layer is formed on the first portion and the second portion of the first conductive layer forming a source and a drain for the transistor. A semiconductor layer is formed over the doping layer of the first portion and the second portion and in the gap in contact with the insulating layer such that upon activation of the gate electrode current flows across the gap directly between the first portion and the second portion in the first conductive layer.

Another transistor, in accordance with the invention, includes a gate electrode layer formed on a substrate and an insulating layer formed on the gate electrode layer. A doping layer has a first portion and a second portion separated by a gap therebetween. The gap is located at a position corresponding to a gate electrode in the gate electrode layer. The first portion and the second portion form a source and a drain for the transistor. A first conductive layer is formed on the doping layer and recessed back from the gap. The conductive layer forms a source electrode and a drain electrode on opposite sides of the gap. A semiconductor layer is formed over the doping layer in a region where the first conductive layer is recessed back from the gap and in the gap in contact with the insulating layer such that upon activation of the gate electrode current flows across the gap directly between the source electrode and the drain electrode.

In alternate embodiments, the first and second portions may include at least a portion formed directly on the insulating layer. The substrate may include glass, and the gate electrode layer may include an opaque metal layer. The insulating layer may include at least one of a nitride, and an oxide. The semiconductor layer may include one of amorphous silicon, polycrystalline silicon, and an organic semiconductor material. The semiconductor layer may include pentacene. The first conductive layer may include a transparent conductor. The doping layer may include doped amorphous silicon. The transistor may include a thin film transistor structure, and the doping layer may include source and drain doped junctions which are directly adjacent to and contacting the semiconductor, layer which forms an accumulated channel in the gap. The semiconductor layer in the gap is preferably substantially free from dopants. The gate electrode may include tapered edges to improve step coverage over the gate electrode. The source and drain electrodes may include tapered edges to improve step coverage over the source and drain. The source electrode or the drain electrode may include a pixel electrode for a liquid crystal display.

A method for fabricating a thin-film transistor (TFT), in accordance with the present invention, includes forming a gate electrode on a substrate, depositing insulation material on the substrate over the gate electrode and depositing a layer of conductive material on the first layer of insulation material and etching the deposited conductive layer to form a source electrode and a drain electrode spaced apart by a gap. The gap corresponds to a position of the gate electrode. A doping layer is deposited on at least a portion the source and drain electrodes. A layer of semiconductor material is deposited on the doping layer on the portions of the source and drain electrodes and the gate insulation material in the gap between the source electrode and the drain electrode such that an accumulated channel forms in the semiconductor material when the TFT is activated by the gate electrode.

In other methods, the step of depositing a layer of second insulation material on the semiconductor material may be included. The method may further include the step of etching a pattern through the second insulation material, through the semiconductor material, and through the doping layer, and terminating into one of the source electrode, drain electrode and the first layer of insulator material. The method may further include the step of forming a data line which connects to at least one of the source electrode the drain electrode, an interconnect between the data line and the gate electrode layer and a storage capacitance electrode. The first conductive material may be transparent. The method preferably consists of four masking steps. The semiconductor material may include at least one of amorphous silicon, amorphous germanium, polycrystalline silicon and organic material. The doping layer may be doped with phosphorus and the step of selectively treating the doping layer with phosphine in a plasma enhanced chemical vapor deposition process may be included.

Another method for fabricating a thin-film transistor (TFT), in accordance with the present invention, includes the steps of forming an opaque gate electrode on a substrate, depositing a first insulation material on the substrate over the gate electrode, depositing a doping layer on the first insulating material and forming a gap in the doping layer corresponding to a position of the gate electrode, depositing a conductive layer and etching the conductive layer to form a source electrode and a drain electrode by employing the gate electrode as a mask to self-align the source electrode and the drain electrode to the gate electrode, and depositing a layer of semiconductor material on the doping layer between the source electrode and the drain electrode and the first insulation material in the gap such that an accumulated channel forms in the semiconductor material when the TFT is activated by the gate electrode.

In other methods, the step of depositing a second layer of insulation material on the semiconductor material may be included. The method may include the step of etching a pattern through the second insulation material, through the semiconductor material and through the doping layer and terminating in one of the conductive layer and the first insulator material. The method may further include the step of depositing a layer of transparent conductive material and etching the transparent conductive material to form at least one of a pixel electrode and a redundant data line. The method may include the step of depositing a conductive layer and etching the conductive layer to form a source electrode and a drain electrode by employing the gate electrode as a mask to self-align the source electrode and the drain electrode to the gate electrode may include the steps of depositing the conductive layer as a layer of transparent conductive material on the first insulation material, employing a positive resist and top illumination exposure to remove unwanted transparent conductive material regions, and etching the transparent conductive material using a negative resist and back illumination exposure to self-align the source electrode and the drain electrode to the gate electrode.

In still other methods, the semiconductor material may include at least one of amorphous silicon, amorphous germanium, polycrystalline silicon and organic material. The doping layer is doped with phosphorus and may further include the step of selectively treating the doping layer with phosphine in a plasma enhanced chemical vapor deposition process.

These and other objects, features and advantages of the present invention will become apparent from the following detailed description of illustrative embodiments thereof, which is to be read in connection with the accompanying drawings.

BRIEF DESCRIPTION OF DRAWINGS

The invention will be described in detail in the following description of preferred embodiments with reference to the following figures wherein:

FIGS. 10A–10G depict process steps for forming a transistor in accordance with the present invention; and FIGS. 11A–11C depict process steps for forming a transistor in accordance with the present invention.

DETAILED DESCRIPTION OF PREFERRED EMBODIMENTS

The present invention includes a high performance TFT structure and a method for fabrication the same. The method includes a low mask count (four masks) for TFT active matrix devices. The present invention is particularly suited for addressing Liquid Crystal Displays (LCD) in the flat panel display technology. The method may be implemented with the existing techniques and is low in cost since fewer photolithographic mask steps are needed. The TFT structure, in accordance with the invention, specifically removes the source-to gate and drain-to-gate overlap capacitance and achieves direct contact of the n+a-Si:H to accumulated i-a-Si:H channel region, thereby, among other items, improving the TFT transient turn-on/turn-off time, reducing the storage capacitor, reducing the contact resistance and improving the on current.

Theoretical and experimental results show that a value! for the field-effect mobility close to the electron band mobility (estimated at between 5 to 25 $cm^2 V^{-1} S^{-1}$) may be achieved when the charge induced in the channel is sufficiently large. Measured TFT mobility is typically about 0.5 to 1 $cm^2 V^{-1} s^{-1}$ and may be limited because of the space-charge-limited current in the un-accumulated (depleted) i-a-Si:H region between the accumulated channel at the semiconductor/gate insulator interface and the Source: and Drain n+a-Si:H. Elimination of this un-accumulated i-a-Si:H region eliminates space-charge-limited current constraints and thus achieves higher intrinsic TFT mobilities.

One way of eliminating the un-accumulated i-a-Si:H region is through a TFT design structure where the source and drain n+a-Si:H junctions are directly adjacent to and contacting the accumulated channel.

One embodiment of the present invention includes a bottom gate, non-staggered (coplanar) TFT structure whose gate may be used as a mask during back side photo resist illumination to produce the self-aligned source and drain electrodes. Subsequent steps selectively incorporate phosphorous (P) atoms into the surface region of the source and drain electrodes or place N+a-Si:H in contact with the source and drain electrodes on the same side (coplanar) that the gate dielectric/a-Si:H TFT channel interface forms. The number of masking steps are decreased to four while providing actual yield improvement through such options as 100% redundant data lines (data metal and transparent conductor) and single or tri-layer film protection between data and gate metal cross-over regions.

Figure 1:
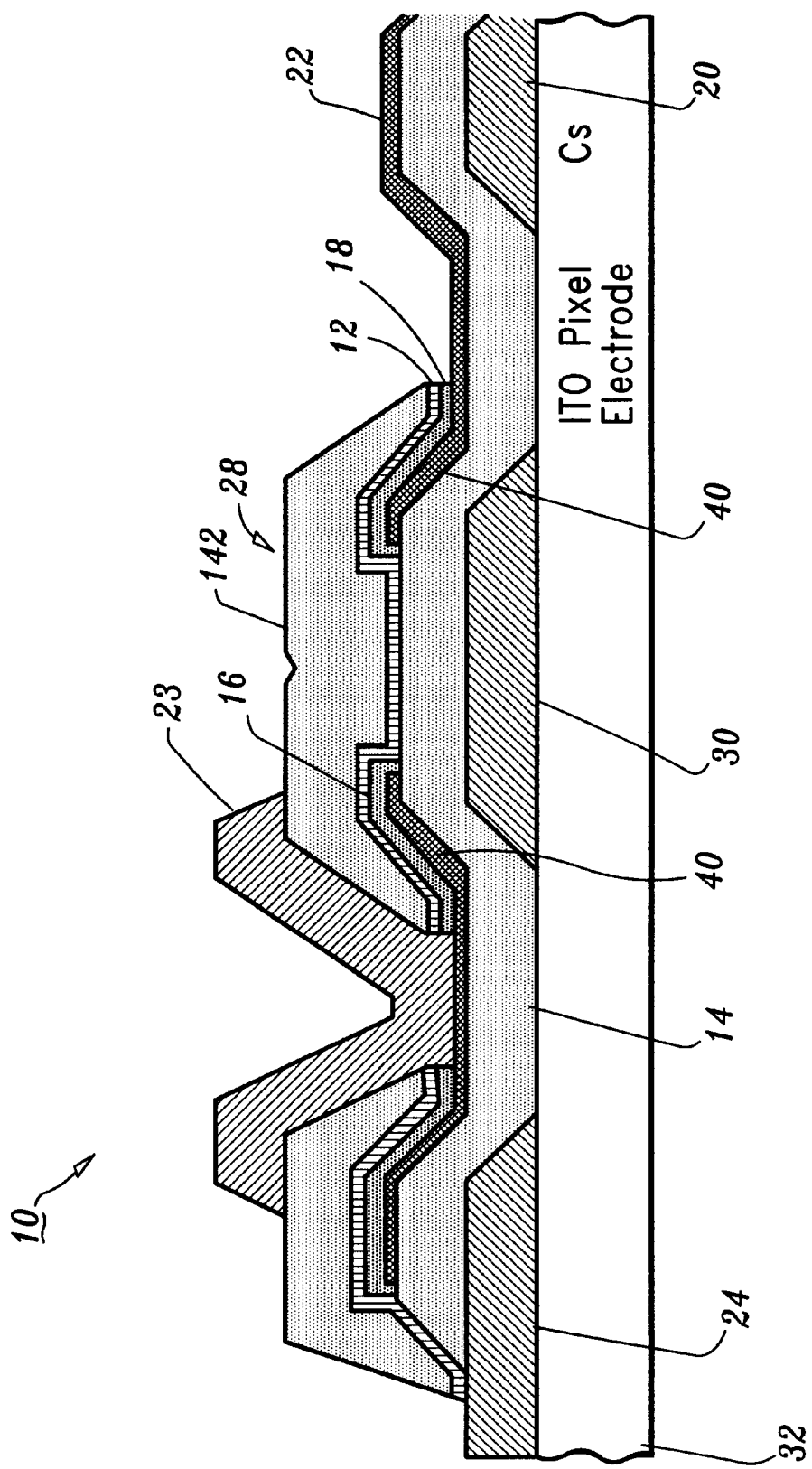
FIG. 1 is a cross-sectional view of a thin film transistor and a storage capacitor taken at section line 1—1 of FIG. 5, in accordance with the present invention.

Referring now to the drawings in which like numerals represent the same or similar elements and initially to FIG. 1, a cross-sectional view of a TFT pixel cell 10 is shown in accordance with one embodiment of the present invention. An accumulated i-a-Si:H film region 12 adjacent to a gate insulator or dielectric 14 provides a current channel that directly connects a source 16 junction and a drain 18 junction (n+a-Si:H junctions). Advantageously, the direct connection of the current channel provides larger currents due to the elimination of an un-accumulated (depleted) i-a-Si:H region adjacent to the n+-a-Si:H junctions that is commonly found in conventional a-Si:H TFTs. TFT pixel 10 includes a storage capacitor 20 for storing charge for a pixel electrode 22. A redundant data line 24 is included for providing data to be displayed by pixel electrode 22 in the event of a failure of a primary data line 23. A gate electrode 30 is also included which is employed for activating a TFT 28. Source and drain electrodes 40 contact source and drain junctions 16 and 18.

The structure shown in FIG. 1 will be described in greater detail in the following description of a method for fabricating the structure. The following method is illustrative of fabrication of a bottom gate, non-staggered inverted TFT structure, other methods may also be employed to realize and practice the invention.

Figure 2:
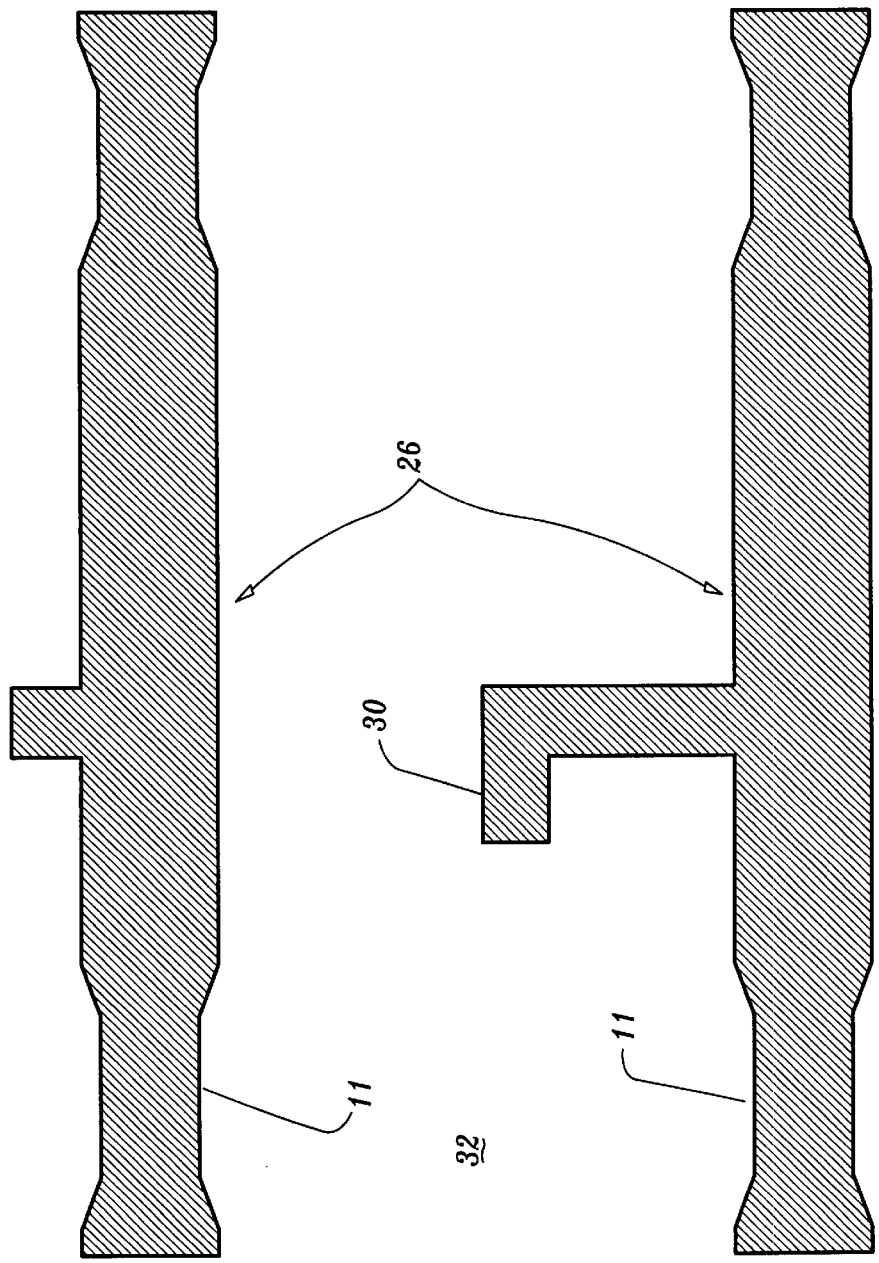
FIG. 2 is a top view of a gate layer of a pixel cell in accordance with the present invention.

Referring to FIG. 2, a pixel cell is depicted after a first masking step in which gate electrodes 30(and gate lines 26) are defined on a glass substrate 32. Gate electrode 30 is formed by a metal or conductor deposition and patterning with lithography as shown in the top view of a pixel layout of FIG. 2. Gate electrode 30 may be a single conductive layer of a metal such as chromium (Cr), tungsten (W), aluminum (Al), copper (Cu) and other electrically equivalent conductors, multilayer structures of metals in a capped or clad arrangement such as chromium above and/or below Al (Cr/Al), Molybdenum over Tungsten (Mo/W), Molybdenum above and/or below Al (Mo/Al), and other similar conductors, and alloy structures, including, for example several percent of Neodymium in Aluminum, etc.

Gate dielectric layer 14 (FIG. 1) which may include, for example, silicon nitride, oxide, oxynitride, or tantalum oxide. Gate dielectric layer 14 may include multi-layers, for example, $SiN_x$, $SiN_x/SiO_y$, $SiN_x/SiO_y/SiN_x$. These layer may be prepared by anodization and/or by plasma enhanced chemical vapor deposition (PECVD), electron cyclotron resonance CVD, laser-assisted CVD, or sputtering. A total film thickness for gate dielectric 14 may be in the range of about 500 Å to about 4000 Å. Gate lines 26 preferably include tapered portions 11 at cross-over points with data lines 24 (see FIG. 3).

Figure 3:
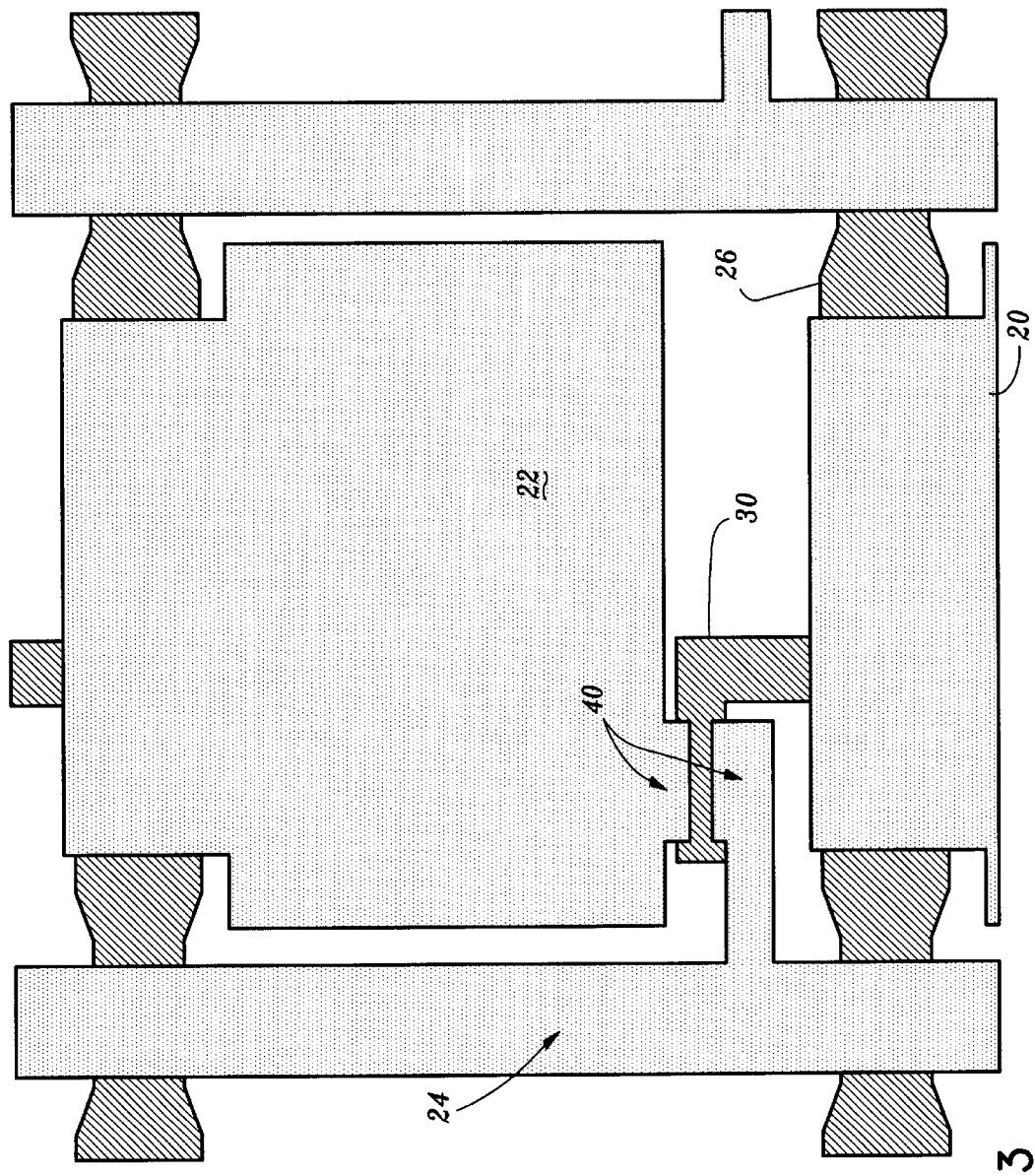
FIG. 3 is a top view of the pixel cell of FIG. 2 having a conductive layer patterned on a dielectric layer (not shown) in accordance with the present invention.

Referring to FIG. 3, a second masking step is employed in which source and drain electrodes 40 of TFT 28 and pixel electrode 22 are defined. It is to be understood that gate dielectric 14 is transparent so that gate lines and electrodes are visible in FIG. 3. The deposition of source and drain electrodes 40 and pixel electrode 22 is performed by employing a transparent conductive material, preferably Indium Tin Oxide (ITO) or Indium Zinc Oxide (IZO), followed by transparent conductive material patterning using a positive resist and top illumination exposure to remove unwanted transparent conductive material regions. FIG. 3 shows a top view of a pixel layout after the photo resist has been removed. Note, as an option, the transparent conductor can also be left behind to form a redundant data line 24 for each line of pixels as shown in FIG. 3 (and FIG. 1). A capacitor storage node 20 is preferably formed for storage capacitor from the transparent conductive material along with the source and drain contacts 40.

Figure 4:
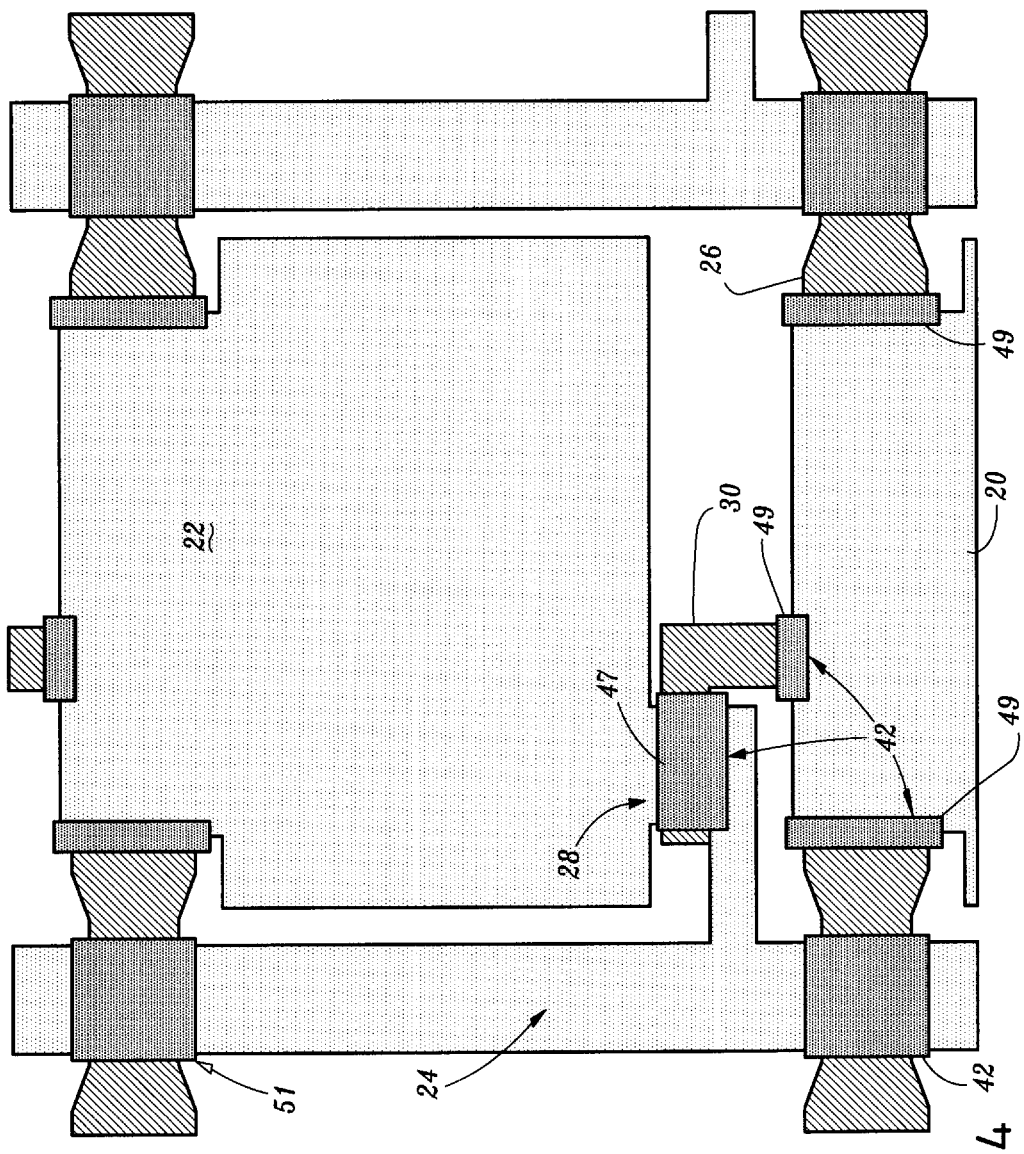
FIG. 4 is a top view of the pixel cell of FIG. 3 having a doping layer, a semiconductor layer and a top dielectric patterned thereon in accordance with the present invention.

Referring to FIG. 4, a third masking step provides patterning for a top dielectric 42, a semiconductor layer which preferably includes amorphous Silicon (a-Si or a-Si:H) 12 (FIG. 1)and a doping layer which may include doped P-doped (alternately N+doped)islands for source 16 and drain 18 are defined (FIG. 1).

Drain and source ohmic contacts 40 (FIG. 3) are preferably doped by a phosphine ($PH_3$) plasma treatment (P-doped) using conventional PECVD equipment to selectively incorporate phosphorous in a surface region of the transparent conductive material at source and drain contacts 40 (see FIG. 3) and not in gate dielectric 14 (FIG. 1). Phosphine plasma treatment effectively covers the transparent conductive material completely including sidewalls as shown in FIG. 1. Phosphine treatment can be followed by an a-Si deposition (which forms a channel (semiconductor layer 12) between source 16 and drain 18 in FIG. 1) and then by a top dielectric layer 42 (for example, silicon nitride, oxide, oxynitride, or tantalum oxide). Top dielectric 42 may also include a multilayer structure, for example, $SiN_x$, $SiN_x/SiO_y$, $SiN_x/SiO_y/SiN_x$. These materials may be successively applied without breaking vacuum conditions, which can ensure a better electrical interface between the a-Si and dielectric layers. The a-Si and top dielectric structure can be deposited by plasma enhanced chemical vapor deposition (PECVD), electron cyclotron resonance CVD, laser-assisted CVD, or sputtering. Individual film thickness may include a range of between about 400 Å to about 4000 Å.

Successive dry etching, in accordance with mask 3, is preferably employed for isolation of the top dielectric 42, a-Si:H 12 and P-doped island 16 and 18 (or the N+a-Si:H, if used). These materials are removed from the transparent conductive material. Note that other implementations can exist where the dry etching (mask 3) for isolation of the top dielectric, a-Si:H and P-doped island (or the N+a-Si:H, if used) leaves portions of these three components behind for TFT 28 (portion 47), and also for storage capacitor (Cs) (portion 49) and cross-over (XO) (portion 51).

In FIG. 4, a top view of a pixel layout that corresponds to the implementation of the dry etching (using mask 3) for isolation of top dielectric 42, a-Si:H 12 and P-doped island 16 and 18 (or the n+a-Si:H, if used). Portions of top dielectric, a-Si:H and P-doped island, remain over the TFT 28 and a data-to-gate metal cross-over (XO) 48.

Figure 5:
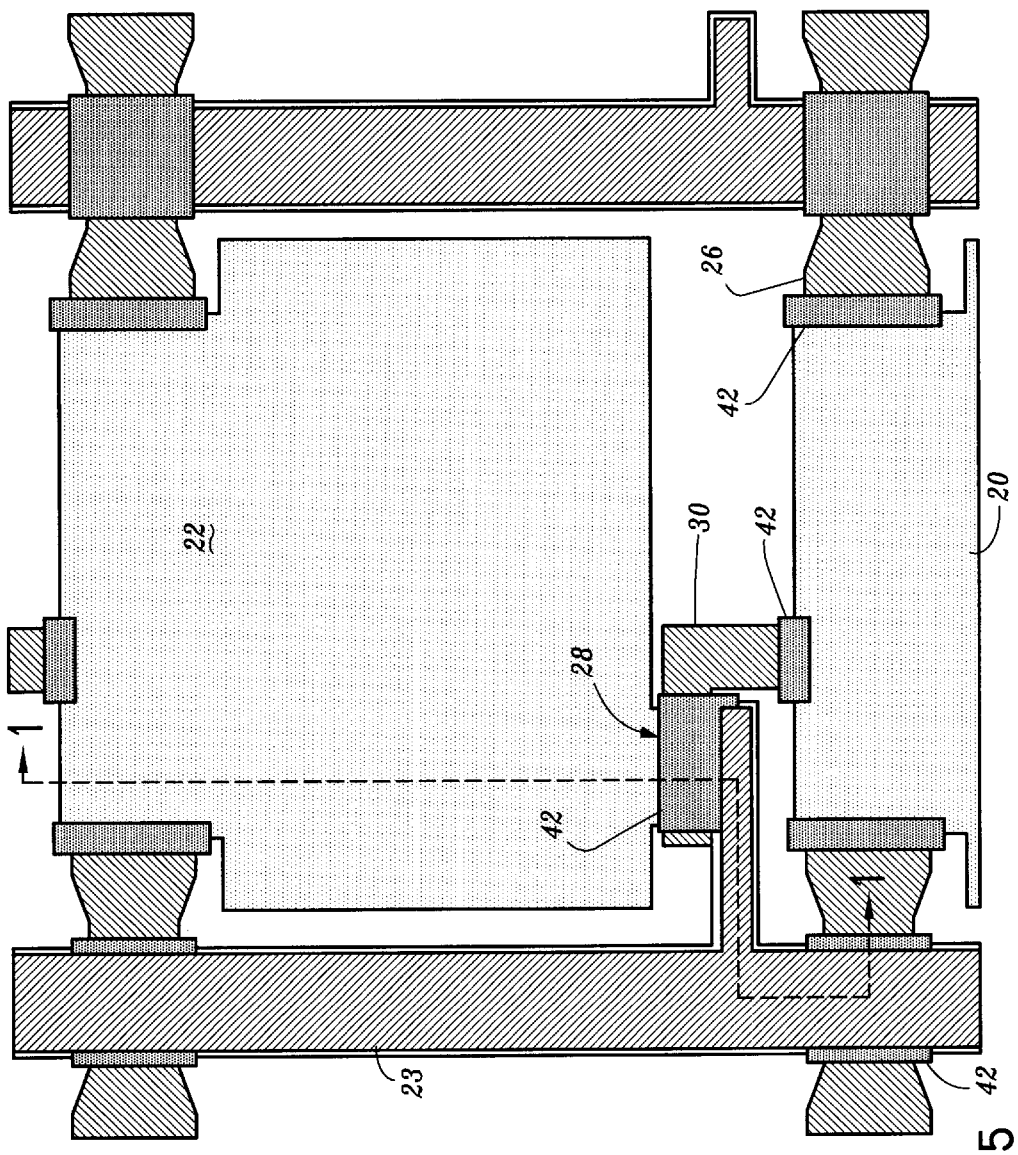
FIG. 5 is a top view of the pixel cell of FIG. 4 having a redundant data line patterned thereon in accordance with the present invention.

Referring to FIG. 5, for mask number 4, data lines are defined. Deposition and etching of data lines in accordance with mask 4 is provided. FIG. 5 shows a top view of a pixel, layout after the etching of data line metal. A cross-sectional view taken at section line 1—1 is shown in FIG. 1.

An additional masking step (masking step 5) may optionally be included. A passivation layer (not shown) may be deposited and defined over the pixel layout using mask step 5. Optional deposition and etching of a passivation layer is possible as a further variation on the above process.

Figure 6:
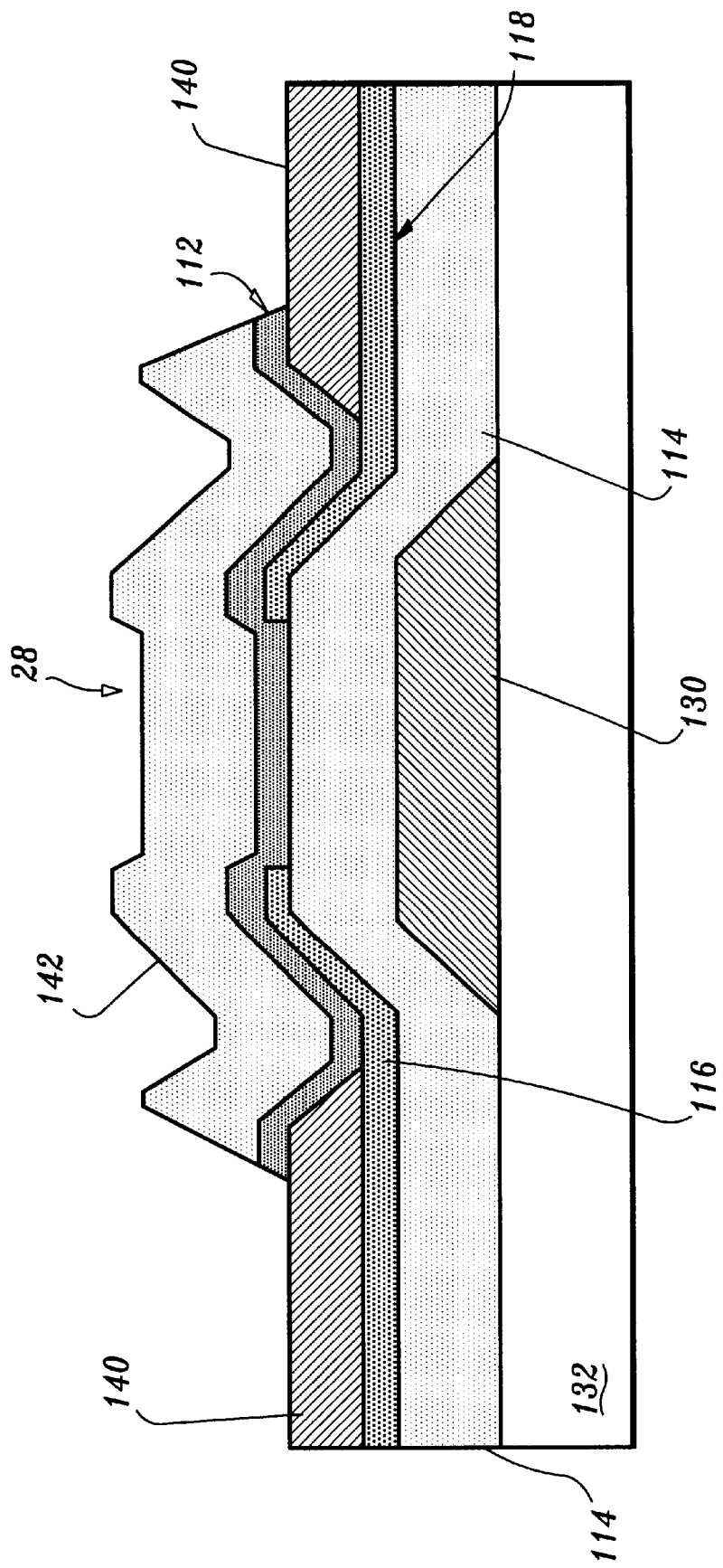
FIG. 6 is a cross-sectional view of another thin film transistor in accordance with the present invention.

Referring to FIG. 6, a cross-sectional view of a TFT pixel cell 100 is shown in accordance with another embodiment of the present invention. An accumulated i-a-Si:H film region 112 adjacent to a gate insulator or dielectric 114 provides a current channel that directly connects a source 116 junction and a drain 118 junction (n+a-Si:H junctions). Advantageously, the direct connection of the current channel provides larger currents due to the elimination of an un-accumulated (depleted) i-a-Si:H region adjacent to the n+-a-Si:H junctions that is commonly found in conventional a-Si:H TFTs. TFT pixel cell 100 may include a storage capacitor (not shown) for storing charge for a pixel electrode. A gate electrode 130 is also included which is employed for activating a TFT 128. Source and drain electrodes 140 contact source and drain junctions 116 and 118.

The structure shown in FIG. 6 will be described in greater detail in the following description of a method for fabricating the structure. The following method is illustrative of fabrication of a bottom gate, non-staggered inverted TFT structure, other methods may also be employed to realize and practice the invention. Processing details are similar to those described previously with noted variations.

Figure 7:
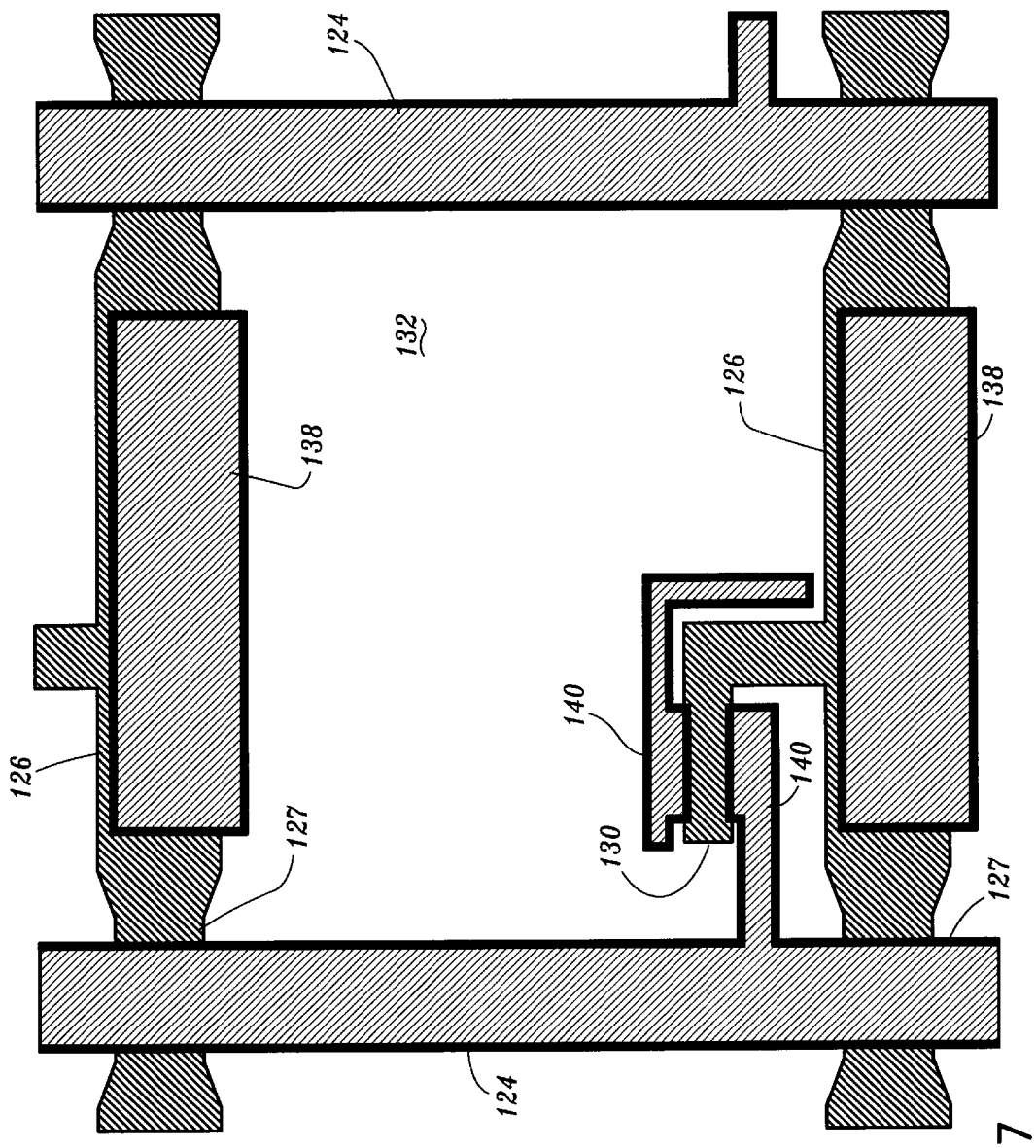
FIG. 7 is a top view of the pixel cell having a conductive layer patterned on a dielectric layer (not shown) over a gate conductor layer in accordance with the present invention.

Referring to FIG. 7, a pixel cell is defined after a first masking step in which gate electrodes 130 (and gate lines 126) are defined on a glass substrate 132. Gate electrode 130 is formed by a metal or conductor deposition and patterning with lithography as shown in the top view of a pixel layout of FIG. 7. Gate electrode 130 may be a single conductive layer of a metal such as chromium (Cr), tungsten (W), aluminum (Al), copper (Cu) and other electrically equivalent conductors, multilayer structures of metals in a capped or clad arrangement such as chromium above and/or below Al (Cr/Al), Molybdenum over Tungsten (Mo/W), Molybdenum above and/or below Al (Mo/Al), and other similar conductors, and alloy structures, including, for example several percent of Neodymium in Aluminum, etc.

Gate dielectric layer 114 (FIG. 6) may include, for example, silicon nitride, oxide, oxynitride, or tantalum oxide. Gate dielectric layer 114 may also include multilayers, for example, $SiN_x$, $SiN_x/SiO_y$, $SiN_x/SiO_y$ /$SiN_x$. These layers may be prepared by anodization and/or by plasma enhanced chemical vapor deposition (PECVD), electron cyclotron resonance CVD, laser-assisted CVD, or sputtering. A total film thickness for gate dielectric 114 may be in the range of about 500 Å to about 4000 Å. Gate lines 126 preferably include tapered portions 127 at cross-over points with data lines 124.

A second masking step is employed in which a doping layer is deposited either directly or by depositing a conductor and doping the conductor. The source 116 and drain 118, which preferably include a transparent conductor, such as, ITO or IZO are formed by patterning the doping layer.

A deposition of a transparent conductor follows in which electrodes 140 are formed. The deposition is followed by self-aligned patterning to the gate electrode 130. There can be a variety of ways to provide this self-alignment. After the transparent conductor deposition, the transparent conductor is etched using positive resist and top illumination exposure to remove unwanted transparent conductor regions (mask #2). Then, etching the transparent conductor using negative resist and back illumination exposure to self-align the transparent conductor (source and drain electrodes 140) to the gate electrode 130. This may need an additional mask (mask #5) compared to the bottom gate non-staggered inverted structure described above. However, self-alignment is provided between source and drain electrodes 140 and gate electrode 130.

Capacitor storage node 138 is formed for the storage capacitor from the transparent conductive material as well. The transparent conductive material is preferably removed by employing a wet etch.

Figure 8:
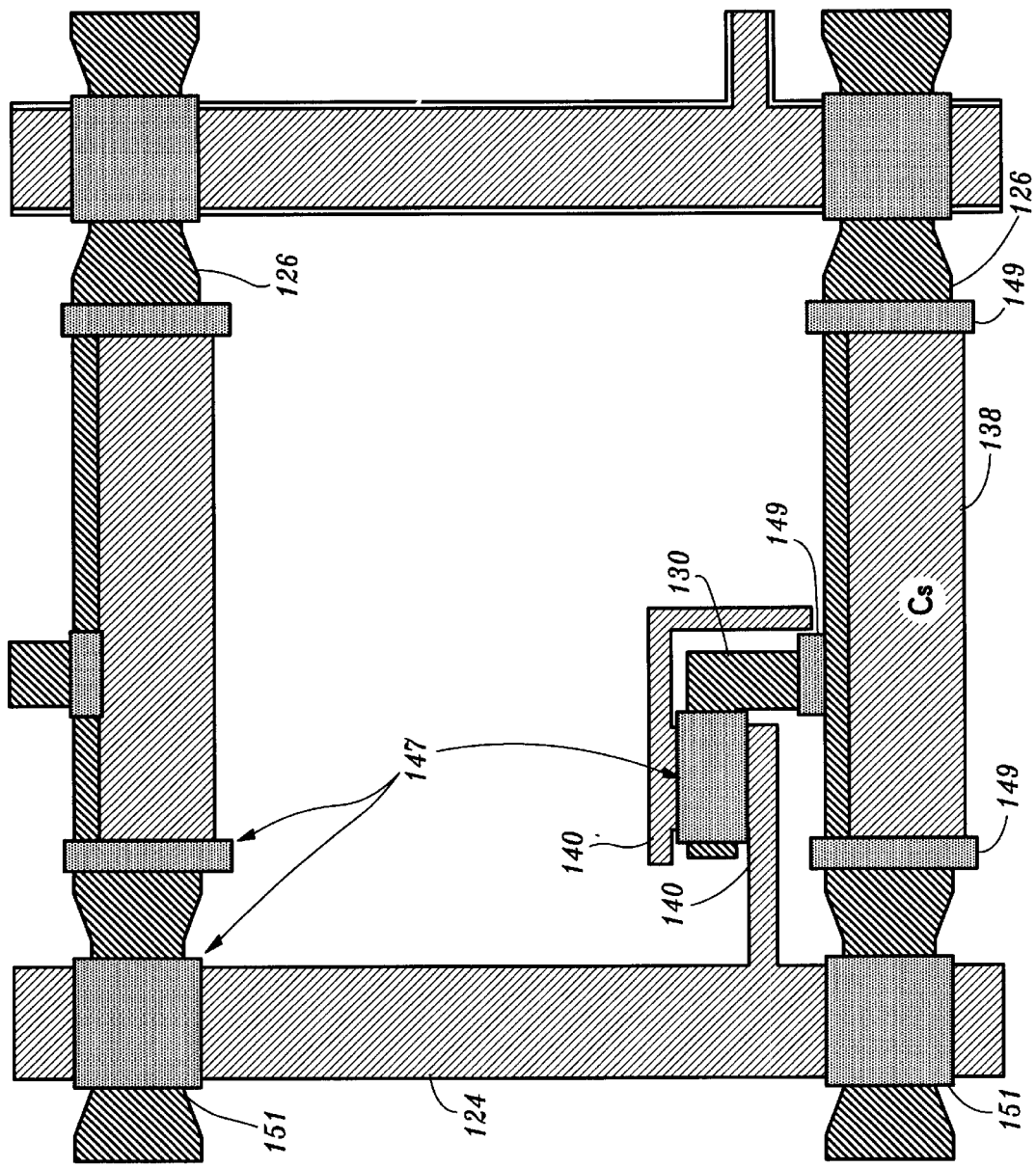
FIG. 8 is a top view of the pixel cell of FIG. 7 having a doping layer, a semiconductor layer and a top dielectric patterned thereon in accordance with the present invention.

Referring to FIG. 8, a third masking step provides patterning for a top dielectric 142, amorphous Silicon (a-Si or a-Si:H) 112 (FIG. 6)and P-doped (alternately N+doped) islands for source 116 and drain 118 (FIG. 6) are defined.

Drain and source ohmic contacts 140 are preferably formed by a phosphine ($PH_3$) plasma treatment (P-doped) using; conventional PECVD equipment to selectively incorporate phosphorous in a surface region of the transparent conductive material at the source and drain and not in gate dielectric 114 (FIG. 6). Phosphine treatment can be followed by an a-Si deposition 112 (which forms a channel between source 116 and drain 118 in FIG. 6) and then by a top dielectric layer 142 (for example, silicon nitride, oxide, oxynitride, or tantalum oxide). Top dielectric 142 may also include a multilayer structure, for example, $SiN_x$, $SiN_x/SiO_y$, $SiN_x/SiO_y/SiN_x$. These materials may be successively applied without breaking vacuum conditions, which can ensure a better electrical interface between the a-Si and dielectric layers. The a-Si and top dielectric structure can be deposited by plasma enhanced chemical vapor;

deposition (PECVD), electron cyclotron resonance CVD, laser-assisted CVD, or sputtering. Individual film thickness may include a range of between about 400 Å to about 4000 Å.

Successive dry etching, in accordance with mask 3, is preferably employed for isolation of the top dielectric 142, a-Si:H 112 and P-doped island 116 and 118 (or the N+a-Si:H, if used). These materials are removed from the transparent conductive material. Note that other implementations can exist where the dry etching (mask 3) for isolation of the top dielectric, a-Si:H and P-doped island (or the N+a-Si:H, if used) leaves portions of these three components behind for TFT 128 (portion 147), and also for storage capacitor (Cs) (portion 149) and cross-over (XO) (portion 151).

Figure 9:
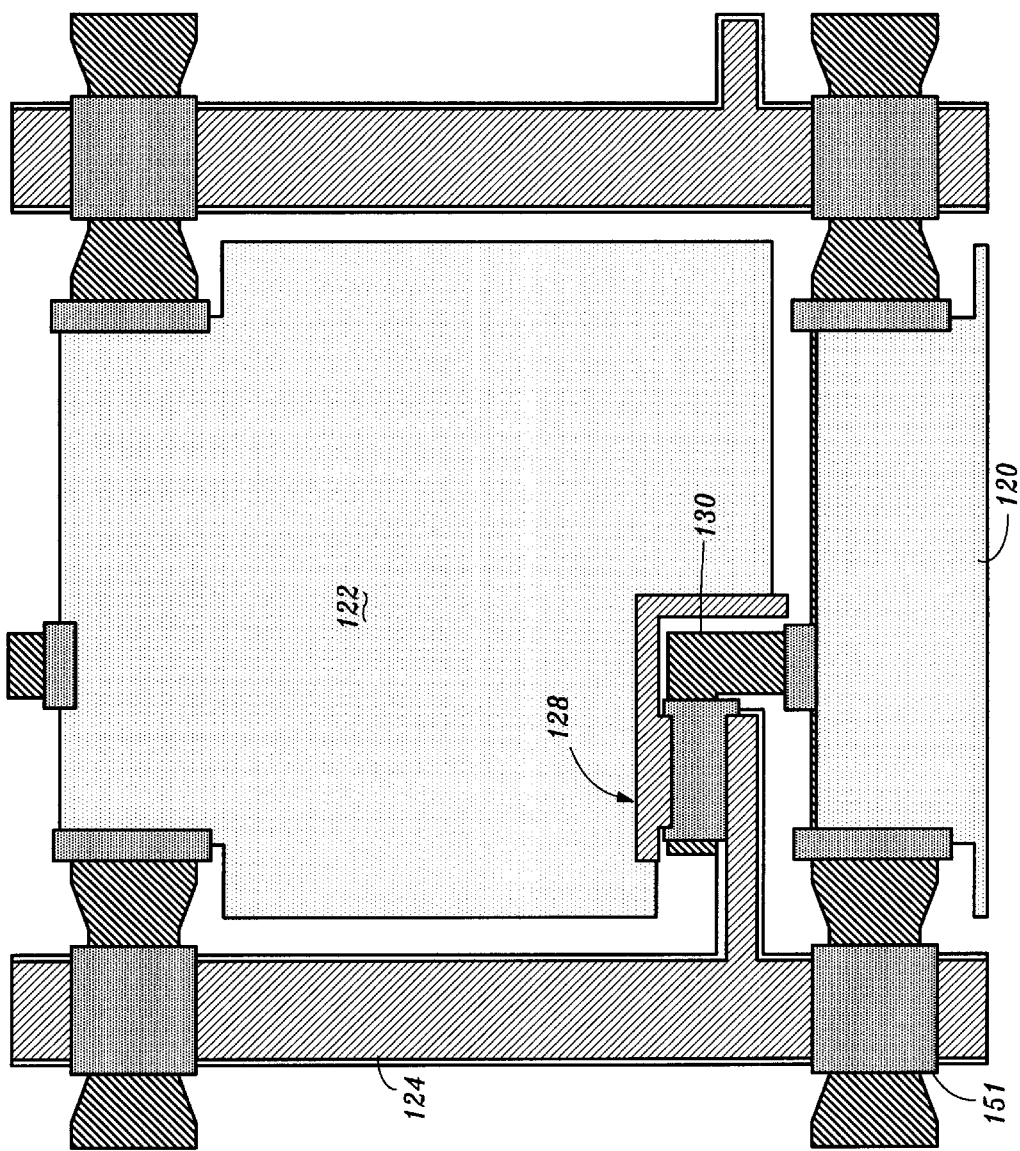
FIG. 9 is a top view of the pixel cell of FIG. 8 having a pixel electrode patterned thereon in accordance with the present invention.

Referring to FIG. 9, for mask number 4, a pixel electrode 122 and a capacitor node 120 are formed by depositing and patterning a transparent conductor. Deposition and etching of pixel electrode 122 and capacitor node 120 in accordance with mask 4 is provided.

An additional masking step (masking step 6) may optionally be included. A passivation layer (not shown) may be deposited and defined over the pixel layout using mask step 6. Optional deposition and etching of a passivation layer is possible as a further variation on the above process.

Referring to FIGS. 10A–G, cross-sectional views of a method for forming a transistor in accordance with the present invention. In FIG. 10A, a substrate 32 preferably is formed from a transparent glass material. A conductive layer is deposited and etched to form a gate electrode 30. Gate electrode 30 preferably includes tapered edges to increase step coverage by gate insulating layer 14 in FIG. 10B. Gate insulating layer 14 may include one or more layers of dielectric material, such as silicon nitride, silicon oxide, silicon oxynitride, aluminum oxide, or other nitrides and oxides and their equivalents. In FIG. 1C, a conductive layer 13 is formed and patterned to leave a gap 15 over gate electrode 25. Conductive layer 13 may include a transparent conductive layer, such as, ITO or IZO. Adjacent to the gap is source electrode and drain electrode 40. These electrodes may connect to data lines or pixel electrodes or other components as needed. Electrodes 40 may include amorphous silicon, polysilicon or other conductive materials. Electrodes 40 are doped with a P-dopant or and N-dopant to form a doping layer including a source 16 and a drain 18. Preferably, a phosphorus dopant is employed in a phosphine treatment process as described above. The doping process is selective to the electrodes 40 thereby preventing dopants from entering insulating layer 14 and other regions. Doping provides a doping layer 17.

A semiconductor layer 12 is formed over source and drain 16 and 18 and in contact with insulating layer 14 in gap 15. Layer 12 forms an accumulated current channel that directly connects source 16 to drain 18 when activated by gate electrode 30 and a sufficient voltage exists between source 16 and drain 18 electrodes. Layer 12 may include a-Si:H, polysilicon, germanium, organic materials, such as, pentacene or equivalents. Advantageously, the direct connection of the current channel provides larger currents due to the elimination of an un-accumulated (depleted) i-a-Si:H region adjacent to the n+-a-Si:H junctions that is commonly found in conventional a-Si:H TFTs. A top dielectric 42 is deposited, which preferably includes silicon nitride (FIG. 10D).

In FIG. 10E, the top dielectric 42, semiconductor layer 12 and optionally the doping layer 17 are patterned to isolate each device. A conductive layer 29, which preferably includes a transparent conductor, is deposited (FIG. 10F) and patterned to form at least one of a capacitor electrode, data lines, redundant data lines 24, etc.

Referring to FIGS. 11A–C, beginning with the structure shown in FIG. 10A, a doping layer 117 is deposited on insulating layer 14 in FIG. 11A. In one embodiment, doping layer 117 is formed by depositing a base material, such as a-Si:H, or polysilicon which is subsequently doped, for example, by employing phosphine treatment, or equivalent. Alternately, a doping layer may be deposited with dopants while forming the layer. A conductive layer 113 is then deposited, which may include a transparent material. In FIG. 11B, layer 113 is overetched, preferably be employing a wet etch process to form electrodes 140. Doping layer 117 is then etched by, for example, an n+reactive ion etch process to form gap 15 between source 116 and drain 118. In FIG. 11C, semiconductor layer 112 is deposited to form an accumulated channel between source 116 and drain 118. A top dielectric 142 is deposited and processing continues as in FIGS. 10E–10G.

In accordance with the present invention, some or all of the following benefits (dependent on the implementation) are included by the high performance a-Si:H TFT active matrix structure and/or process:

1.) Self alignment of the source/drain metal electrode to the gate electrode, thus minimizing the drain-to-gate and source-to-gate capacitance (Cgd, Cgs) induced pixel charging error.

2.) Improved on-current drive due to independent optimization possible by (1) the elimination of the depleted i-a-Si:H region between the n+a-Si:H junctions and the accumulated channel regions, thus reducing the space charge limited current effect and (2) the optimization of the a-Si film thickness.

3.) Reduction of TFT channel lengths, which in one implementation, are only dependent on the photolithography and etching biases of the gate metal electrode.

4.) Low Off currents since selective deposition of Phosphorus or n+a-Si:H etching prevents coverage from taking place in the region adjacent to the source or drain electrode.

5.) True TFT scalability since TFT performance is independent of i-a-Si:H layer thickness and thickness variations across the display due to the source and drain contacts to the a-Si:H layer are non-staggered (coplanar).

6.) Data line open yield improvement due to 100% redundancy of data line through data metal and transparent pixel conduct. Other advantages and benefits are also realized by the invention.

It is to be understood that the structures shown in the FIGS. may be employed with a top gate electrode. The structures shown would thereby include a gate on the opposite side of the accumulated channel relative to the substrate, i.e., on top of the structure instead of below it. Further, tapered gates and source/drain electrodes may be left substantially perpendicular to major surfaces thereof.

Having described preferred embodiments of a high performance thin film transistor and active matrix process for flat panel displays (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. An active matrix array, comprising:
   a substrate;
   a plurality of gate electrodes and gate lines, which are patterned from a first conductive layer formed on the substrate using a first photolithographic process;
   an insulating layer formed on the gate electrodes, gate lines and substrate;
   a plurality of source electrodes, drain electrodes and pixel electrodes, which are patterned from a second conductive layer formed on the insulating layer using a second photolithographic process;
   a doping layer formed on the source electrodes and drain electrodes for forming sources and drains;
   a semiconductor layer that forms an accumulated channel between each source and drain;
   a top dielectric layer formed on the semiconductor layer, wherein the doping layer, semiconductor layer and top dielectric layer are patterned together using a third photolithographic process to isolate devices and components of the array; and
   a plurality of data lines which are patterned from a third conductive layer using a fourth photolithographic process.

2. The active matrix array of claim 1, wherein the substrate comprises a transparent material and the active matrix array comprises an active matrix liquid crystal display.

3. The active matrix array of claim 1, wherein the second and third conductive layers are transparent.

4. The active matrix array of claim 1, comprising a plurality of pixel storage capacitors, wherein each pixel storage capacitor is formed by one of the pixel electrodes and a portion of a gate line adjacent to the pixel electrode separated by the insulating layer.

5. The active matrix array of claim 1, further comprising redundant data lines that are patterned from the first conductive layer or second conductive layer, or both.

6. The active matrix array of claim 1, wherein the gate electrodes comprise tapered edges.

7. An active matrix array, comprising:

a substrate;

a plurality of gate electrodes and gate lines, which are patterned from a first conductive layer formed on the substrate using a first photolithographic process;

an insulating layer formed on the gate electrodes, gate lines and substrate;

a doping layer formed on the insulating layer;

a second conductive layer formed on the doping layer, wherein the doping layer and second conductive layer are patterned together using a second photolithographic process to form a plurality of sources, drains, source electrodes, drain electrodes and pixel electrodes;

a semiconductor layer for forming an accumulated channel between each source and drain in the array;

a top dielectric layer formed on the semiconductor layer, wherein the semiconductor layer and top dielectric layer are patterned together using a third photolithographic process to isolate devices and components of the array; and a plurality of data lines which are patterned from a third conductive layer using a fourth photolithographic process.

8. The active matrix array of claim 7, wherein the substrate comprises a transparent material and the active matrix array comprises an active matrix liquid crystal display.

9. The active matrix array of claim 7, wherein the second and third conductive layers are transparent.

10. The active matrix array of claim 7, comprising a plurality of pixel storage capacitors, wherein each pixel storage capacitor is formed by one of the pixel electrodes and a portion of a gate line adjacent to the pixel electrode separated by the insulating layer.

11. The active matrix array of claim 7, further comprising redundant data lines that are patterned from the first conductive layer or second conductive layer, or both.

12. The active matrix array of claim 7, wherein the gate electrodes comprise tapered edges.

* * * * *